United States Patent [19]
Yamamoto et al.

[11] Patent Number: 6,060,963
[45] Date of Patent: May 9, 2000

[54] LADDER-TYPE PIEZOELECTRIC FILTER WITH LID PROVIDING PREDETERMINED CONTACT PRESSURE AND METHOD OF MANUFACTURING SAME

[75] Inventors: Takashi Yamamoto, Ishikawa-ken; Hirofumi Funaki, Toyama-ken, both of Japan

[73] Assignee: Murata Manufacturing Co., Ltd., Japan

[21] Appl. No.: 09/286,052

[22] Filed: Apr. 5, 1999

[30] Foreign Application Priority Data

May 11, 1998 [JP] Japan ................... 10-127224

[51] Int. Cl.⁷ ............... H03H 9/58; H03H 9/10; H03H 3/02
[52] U.S. Cl. .................... 333/189; 310/348; 29/25.35
[58] Field of Search ............. 333/189, 187–192; 310/348; 29/25.35

[56] References Cited

U.S. PATENT DOCUMENTS

| | | | |
|---|---|---|---|
| 4,353,045 | 10/1982 | Matsui et al. | 333/189 X |
| 4,532,451 | 7/1985 | Inoue | 310/348 X |
| 4,656,385 | 4/1987 | Tanaka | 333/189 X |
| 5,543,763 | 8/1996 | Oyama | 333/189 |
| 5,565,824 | 10/1996 | Nagano | 333/189 |
| 5,598,133 | 1/1997 | Fuse | 333/189 |
| 5,705,880 | 1/1998 | Shimura et al. | 333/189 X |

FOREIGN PATENT DOCUMENTS

| | | |
|---|---|---|
| 7-7367 | 1/1995 | Japan . |
| 7-235859 | 9/1995 | Japan . |
| 8-237073 | 9/1996 | Japan . |

*Primary Examiner*—Robert Pascal
*Assistant Examiner*—Barbara Summons
*Attorney, Agent, or Firm*—Graham & James LLP

[57] ABSTRACT

An input terminal and a first output terminal having lead portions are juxtaposed at the bottom of the case of a ladder-type piezoelectric filter, and substantially rectangular series resonators adapted to vibrate in a longitudinal vibration mode are disposed on the input terminal and the first output terminal. A connection terminal having no lead portion is placed on the series resonators, and one parallel resonator is placed on the connection terminal. Subsequently, a ground terminal having a lead portion is placed on the parallel resonator. Subsequently, the other parallel resonator is placed on the ground terminal, and a second output terminal having a lead portion is placed on the parallel resonator. The lead portions of the terminals are fitted into grooves that are formed on the inner surface of the case and extend in the depth direction, so that the lead portions are positioned. A lid is fitted into the opening portion of the case and welded to the inner surface of the opening portion in a state in which the components accommodated in the case are pressed in the thickness direction. Resin is disposed into a concave space formed between the lid and the opening portion of the case.

20 Claims, 5 Drawing Sheets

LADDER-TYPE PIEZOELECTRIC FILTER WITH LID PROVIDING PREDETERMINED CONTACT PRESSURE AND METHOD OF MANUFACTURING SAME

BACKGROUND OF THE INVENTION

1. Field of the Invention

The present invention relates to a ladder-type piezoelectric filter and a method of manufacturing such a ladder-type piezoelectric filter. More particularly, the present invention relates to a structure of the ladder-type piezoelectric filter and a method for assembling components of the ladder-type piezoelectric filter into a case.

2. Description of the Related Art

In a conventional ladder-type piezoelectric filter, series resonators, parallel resonators, and terminal plates are stacked in the thickness direction of the filter and connected to one another in order to define a ladder circuit. The resonators and terminal plates are disposed in a box-shaped case which has an opening portion at one surface thereof. The opening portion is covered by an insulating paper, and sealing resin is provided on the insulating paper, to thereby seal the case (see Japanese Patent Application Laid-Open (Kokai) No. 3-255713).

During assembly of a conventional ladder-type filter, resonators and terminal plates are inserted one by one into the opening portion of a case so as to be arranged parallel to the inner wall of the case. Consequently, only a very small space is left for the last component to be inserted into the case, resulting in great difficulty in inserting the last component into the case.

Also, some of the terminal plates are designed to produce spring force in order to provide proper contact pressure. However, due to the contact pressure, when a terminal plate or a resonator is inserted into the case, the electrode of the resonator rubs against a projection on the terminal plate, thereby damaging the electrode and resulting in substantially decreased electrical reliability.

The thickness of each terminal plate, the thickness of each resonator, and the interior dimensions of the case are designed such that a constant pressure is applied onto the components which are disposed in the case. Therefore, each of the components must have a precise thickness. However, since the resonators are made of a piezoelectric ceramic material, considerable variations in thicknesses result. Also, the terminal plates have varying thicknesses due to formation of the projections disposed thereon. As a result, a constant contact pressure is not obtained, thereby significantly decreasing electrical reliability.

Moreover, in the conventional ladder-type filter, the lead portion of a terminal is not reliably and securely supported and the positions of the lead portions of a completed filter vary accordingly, resulting in problems in mounting the filter on a printed board or the like.

SUMMARY OF THE INVENTION

To overcome the problems described above, preferred embodiments of the present invention provide a ladder-type piezoelectric filter which can be assembled, according to a method of the present invention, easily and without experiencing any of the above-described problems.

According to one preferred embodiment of the present invention, a ladder-type piezoelectric filter includes a case having a box-like shape and an opening portion at one surface thereof, the case having grooves formed on an inner surface such that the grooves extend in the depth direction of the case, a plurality of terminals accommodated in the case and arranged substantially parallel to a bottom surface of the case, each terminal having a lead portion which is integral with the terminal, fitted into the corresponding groove of the case, and projecting from the opening portion of the case, series resonators and parallel resonators, the series and parallel resonators and the terminal plate portions being arranged in the case substantially parallel to the bottom surface of the case such that the series resonators and the parallel resonators are layered together with the terminals and are connected to one another to define a ladder circuit, a lid fitted into the opening portion of the case such that the lid presses, in the thickness direction, the terminals and the resonators provided in the case and the lid is welded to the inner surface of the opening portion, and a sealing resin is disposed in a space defined between the lid and the opening portion of the case.

In the above described ladder-type piezoelectric filter, terminals and resonators are placed in the depth direction into a case such that the terminals and resonators become substantially parallel to each other. Finally, a lid is fitted into the opening portion of the case and is pressed downward in order to obtain a predetermined contact pressure. While this pressed state is maintained, the lid is welded to the inner surface of the opening portion of the case through use of an iron or similar tool. Subsequently, the sealing resin is disposed into the space defined between the lid and the opening portion of the case, to thereby completely seal the interior of the case.

As described above, preferred embodiments of the present invention eliminate the need to insert resonators and terminals one by one into a narrow space within a case. Instead, the resonators and terminals are layered in the thickness direction in the case and are pressed via a lid so as to secure a desired sufficient contact pressure. Therefore, no rubbing occurs between the electrode of a resonator and a projection of a terminal, so that no damage is imparted to the surface of the electrode of the resonator. In addition, no difficult insertion work is required. Further, even if there is variation in thickness of the components, a constant contact pressure is obtained through control of the amount of depression of the lid, thereby eliminating the requirement for high precision in the thicknesses of the components. Further, an electrically reliable ladder-type filter is produced. Also, since the welding position where the lid is welded to the case is not fixed, the lid can be welded at an arbitrary position without causing any problem. Therefore, variation in thickness of the components can be easily absorbed through adjustment of the welding position. In other words, even if different ladder-type filters use resonators having different thicknesses, parts such as a case, terminals, and a lid can be commonly used, so that a variety of types of ladder-type filters can be produced at low cost.

In preferred embodiments of the present invention, since the terminals are arranged in the case substantially parallel to the bottom surface thereof, the lead portions of the terminals are bent so as to project from the opening portion of the case. In relation to such a structure, there has conventionally been a fear that the lead portion of a terminal disposed at the bottom of the case contacts a terminal disposed above the terminal located at the bottom, resulting in a short circuit. In view of such a problem, in preferred embodiments of the present invention, the lead portion of a terminal is fitted into the corresponding groove formed on the inner surface of the case in order to prevent contact with another terminal. Also, since the lead portion is fitted into the corresponding groove of the case, the position of the lead portion is stabilized, thereby solving problems involved in mounting the filter on a printed board or the like.

Preferably, the series resonators are defined by piezoelectric resonators adapted to vibrate in a longitudinal vibration mode and are juxtaposed on the bottom surface of the case to be substantially parallel to each other, and the parallel resonators are defined by piezoelectric resonators adapted to vibrate in a square vibration mode and are stacked in the depth direction of the case. With this unique configuration, the height or vertical dimension of the case is significantly decreased as compared with the case where both the series resonators and the parallel resonators are defined by piezoelectric resonators adapted to vibrate in a square vibration mode.

More preferably, an input terminal and a first output terminal each having a lead portion are juxtaposed at the bottom of the case; a series resonator is placed on each of the input terminal and the first output terminal; an independent terminal having no lead portion is placed on the series resonators such that the independent terminal contacts the series resonators; one parallel resonator is placed on the independent terminal; a ground terminal having a lead portion is placed on the one parallel resonator; the other parallel resonator is placed on the ground terminal; and a second output terminal having a lead portion is placed on the other parallel resonator. This structure requires no intricately shaped terminal plate portions. Consequently, the shapes of the terminals and their machining can be simplified.

Other features and advantages of the present invention will become apparent from the following description of preferred embodiments of the present invention which refers to the accompanying drawings.

DETAILED DESCRIPTION OF PREFERRED EMBODIMENTS

FIGS. 1–4 show a ladder-type piezoelectric filter according to preferred embodiments of the present invention.

Figure 5:
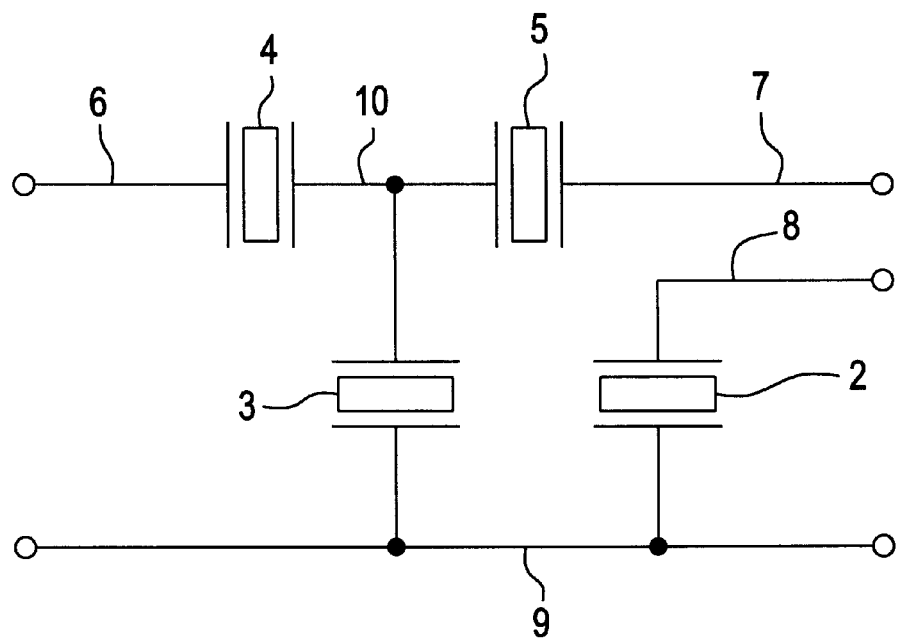
FIG. 5 is a circuit diagram of the ladder-type piezoelectric filter of FIG. 1.

The present preferred embodiment is a ladder-type filter including four elements which constitute a circuit as shown in FIG. 5. A case 1 accommodates two parallel resonators 2 and 3, two series resonators 4 and 5, one input terminal 6, two output terminals 7 and 8, one ground terminal 9, and one independent connection terminal 10. These components are pressed and held by a lid 11, and the case 1 is sealed with resin 12.

The case 1 is preferably made of a thermoplastic resin and has a box-like shape. The case 1 includes an opening portion 1a at one surface thereof (an upper surface in the present preferred embodiment). A rib 1b is provided on each of the four inner surfaces of the case 1 such that the rib 1b extends in a depth direction (vertical direction). The ribs 1b position the four circumferential sides of each of the parallel resonators 2 and 3, the output terminal 8, the ground terminal 9, and the independent connection terminal 10, to thereby prevent rotation or movement of these components within the case 1. The upper end of the rib 1b is recessed from the opening portion 1a of the case 1. A vertically extending groove 1c is formed on either side of each of two opposite ribs 1b. The lead portions 6b–9b of the terminals 6–9 are fitted into the grooves 1c for positioning of the lead terminals 6–9.

Each of the parallel resonators 2 and 3 is preferably defined by a piezoelectric resonator adapted to vibrate in a square vibration mode. Electrodes 2a and 2b are respectively provided on the entire upper and lower major surfaces of the parallel resonator 2. Likewise, electrodes 3a and 3b are respectively provided on the entire upper and lower major surfaces of the parallel resonator 3.

Figure 7:
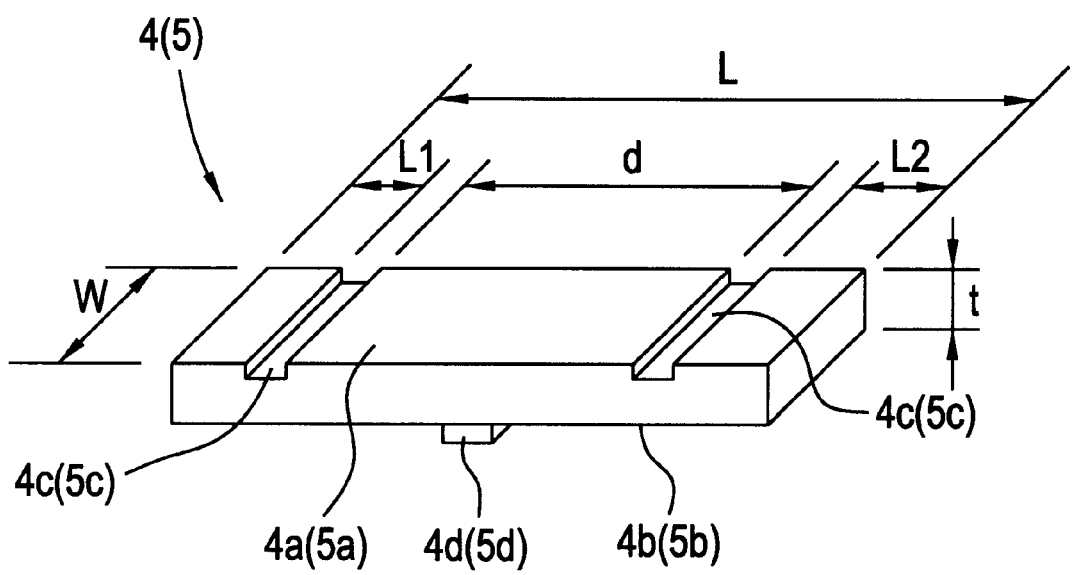
FIG. 7 is a perspective view of a series resonator.

The series resonators 4 and 5 are preferably defined by substantially rectangular piezoelectric resonators adapted to vibrate in a longitudinal vibration mode. Electrodes 4a and 4b are respectively provided on the entire upper and lower major surfaces of the series resonator 4. Likewise, electrodes 5a and 5b are respectively provided on the entire upper and lower major surfaces of the series resonator 5. As shown in FIG. 7, in order to divide the electrode 4a, two grooves 4c are provided on the upper major surface of the series resonator 4 at symmetrical positions with respect to a center-line which is substantially perpendicular to the longitudinal direction of the series resonator 4 such that the pair of grooves 4c extend in a direction substantially parallel to the center-line of the series resonator 4. In order to divide the electrode 5a, two grooves 5c are provided on the upper major surface of the series resonator 5 at symmetrical positions with respect to the center-line which is substantially perpendicular to the longitudinal direction of the series resonator 5 such that the pair of grooves 5c extend in a direction that is substantially parallel to the center-line of the series resonator 5. A distance L1 between one groove 4c (5c) and the corresponding substantially parallel edge of the resonator 4 (5) is preferably substantially equal to a distance L2 between the other groove 4c (5c) and the corresponding substantially parallel edge of the resonator 4 (5). The groove 4c (5c) has a depth such that the groove 4c (5c) divides the electrode 4a (5a) into three regions. Although in this preferred embodiment of the present invention the groove 4c (5c) is formed to extend into the piezoelectric body, the groove 4c (5C) is not required to be formed to extend into the piezoelectric body.

A support member 4d (5d) made of a conductive material is disposed on the lower major surface of the electrode 4b (5b) at a substantially central position of the electrode in the longitudinal direction such that the support member 4d (5d) extends substantially parallel to the shorter side of the series resonator 4 (5). The support members 4d and 5d prevent positional shift of the series resonators 4 and 5 caused by friction, while establishing electrical connection between the input terminal 6 and the output terminal 7, which will be described later. Since the series resonators 4 and 5 are arranged side by side at the bottom of the case 1, the overall thickness of the filter can be decreased as compared with the case of a conventional ladder-type filter in which resonators adapted to vibrate in a square vibration mode are stacked on each other.

The input terminal 6 has an electrode plate portion 6a and a lead portion 6b bent so as to extend substantially perpendicular to the electrode plate portion 6a. The electrode plate portion 6a is disposed on the bottom surface of the case 1. The lead portion 6b is fitted into the corresponding groove 1c of the case 1, and projects from the opening portion 1a of the case 1. The support member 4d of the series resonator 4 contacts the upper surface of the electrode plate portion 6a so as to establish electrical contact therewith.

The output terminal 7 preferably has a shape that is substantially identical to that of the input terminal 6. The output terminal 7 has an electrode plate portion 7a, and a lead portion 7b bent so as to extend substantially perpendicular to the electrode plate portion 7a. The electrode plate portion 7a is disposed on the bottom surface of the case 1. The lead portion 7b is fitted into the corresponding groove 1c of the case 1, and projects from the opening portion 1a of the case 1. The support member 5d of the series resonator 5 contacts the upper surface of the electrode plate portion 7a so as to establish electrical contact therewith.

The output terminal 8 is preferably made of a conductive spring plate. The output terminal 8 has a substantially square electrode plate portion 8a that is substantially equal in area to the parallel resonators 2 and 3, and a lead portion 8b bent so as to extend substantially perpendicular to the electrode plate portion 8a. From the approximate central portion of the electrode plate portion 8a, a contacting portion 8c projects downwardly so as to contact the upper-surface electrode 2a of one parallel resonator 2. Also, the electrode plate portion 8a is downwardly curved so as to form a substantially hemispherical contact surface. Therefore, the output terminal 8 has elasticity in its thickness direction. The lead portion 8b is fitted into the corresponding groove 1c of the case 1, and projects from the opening portion 1a of the case 1.

Although the output terminals 7 and 8 are provided separately, their respective lead portions 7b and 8b are connected to each other in an external circuit (for example, on a printed board).

The ground terminal 9 has an electrode plate portion 9a and a lead 9b. The electrode plate portion 9a has a folded structure and is substantially equal in surface area to that of the parallel resonators 2 and 3. The lead portion 9b is bent so as to extend substantially perpendicular to the electrode plate portion 9a. The lead portion 9b is fitted into the corresponding groove 1c of the case 1, and projects from the opening portion 1a of the case 1. From the approximate central portion of the upper surface of the electrode plate portion 9a, a contacting portion 9c projects upwardly so as to contact the lower-surface electrode 2b of the parallel resonator 2 (see FIG. 3). From the approximate central portion of the lower surface of the electrode plate portion 9a, a contacting portion 9d projects downwardly so as to contact the upper-surface electrode 3a of the parallel resonator 3 (see FIG. 3).

The independent connection terminal 10 is a separate terminal having no lead portion, and is a substantially square plate which is substantially equal in surface area to that of the parallel resonators 2 and 3. From the approximate central portion of the lower surface of the independent connection terminal 10, a contact portion 10a projects upwardly so as to contact the lower-surface electrode 3b of the parallel resonator 3. Ridge-shaped contact portions 10b and 10c project downwardly from the surface of the independent connection terminal 10 such that the contact portions 10b and 10c extend along a line which passes through the contact portion 10a and substantially parallel to one side of the independent connection terminal 10. The contact portion 10b (10c) contacts the approximate central portion of the upper-surface electrode 4a (5a) of the series resonator 4 (5). That is, the contact portion 10b (10c) contacts the approximate central portion of the electrode which is isolated from the side portions by two grooves 4c (5c). The connection terminal 10 is used for establishing electrical connection between the two series resonators 4 and 5 and the single parallel resonator 3.

Figure 1:
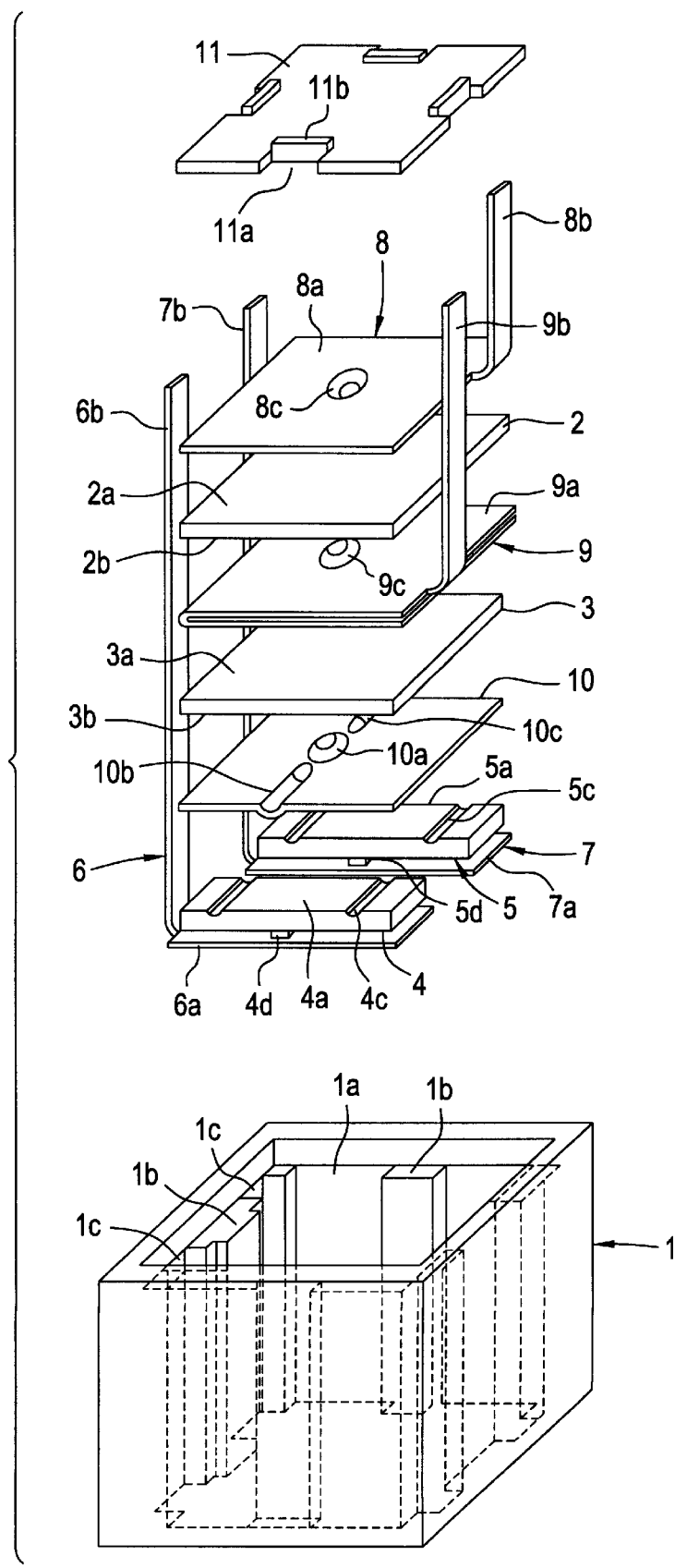
FIG. 1 is an exploded perspective view of a ladder-type piezoelectric filter according to a preferred embodiment of the present invention.
Figure 2:
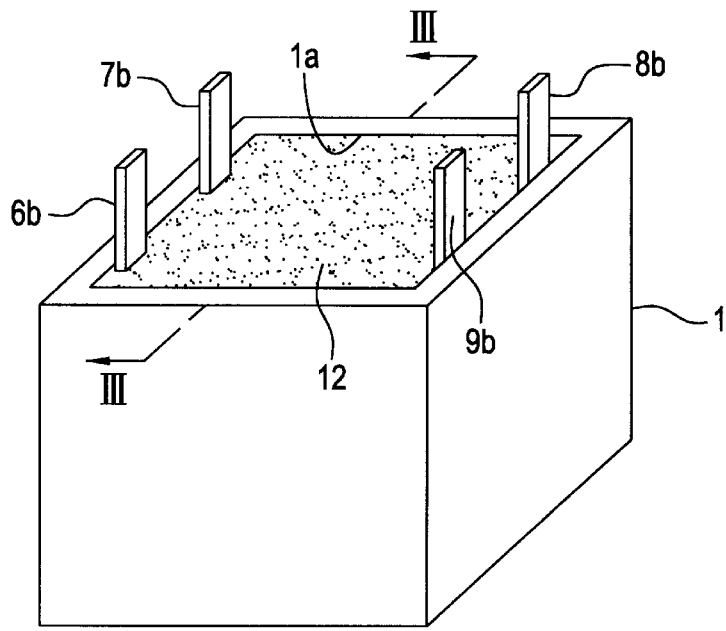
FIG. 2 is a perspective view of the ladder-type piezoelectric filter of FIG. 1 in an assembled state.
Figure 3:
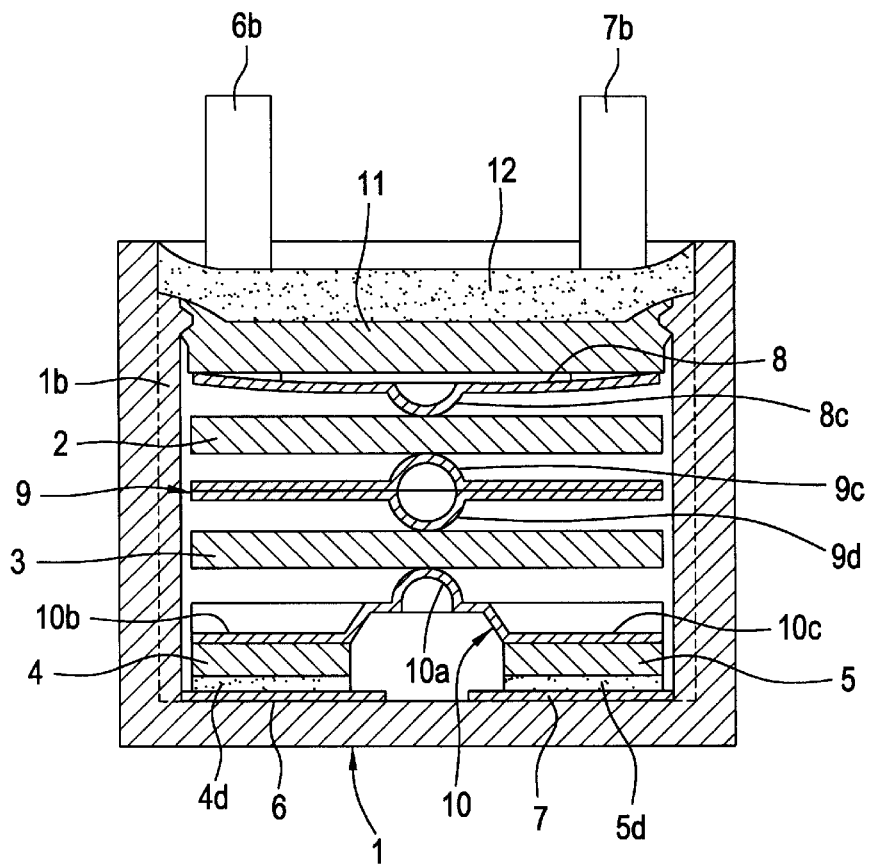
FIG. 3 is a sectional view taken along line lll—lll in FIG. 2.
Figure 4:
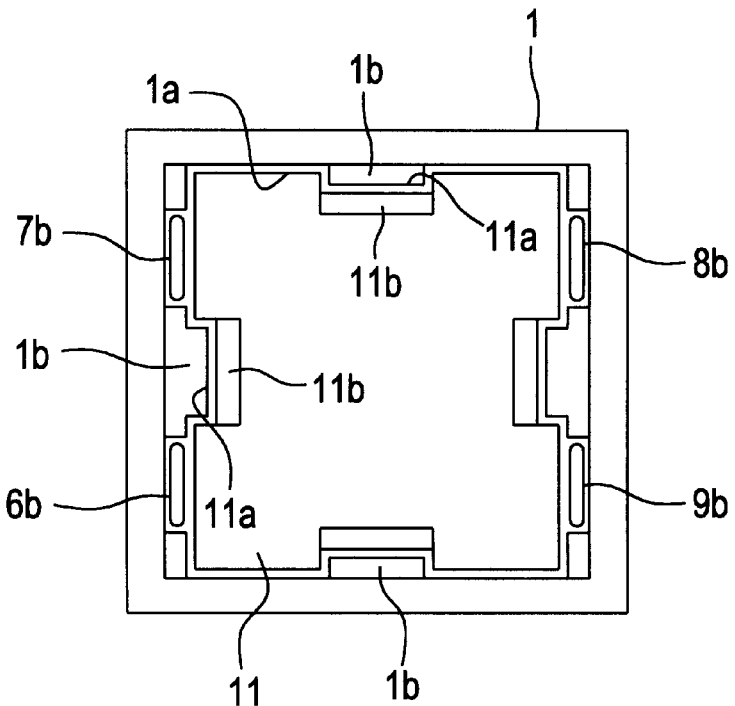
FIG. 4 is a bottom view of the ladder-type piezoelectric filter of FIG. 1 before resin is applied thereto.

The generally square lid 11 is preferably made of the thermoplastic resin that is used to form the case 1. As shown in FIG. 4, the lid 11 has a size such that the lid 11 can be fitted into the opening portion 1a of the case 1, especially, into a deeper side of the opening portion 1a where the ribs 1b are located. For this deep fitting, a recess 11a for engaging the corresponding rib 1b is formed in each of the four sides of the lid 11. A projection 11b used for welding projects upwardly from the inner edge of each of the recesses 11a.

Next, a method of assembling the ladder-type filter having the above-mentioned structure will be described by reference to FIGS. 6A to 6D.

First, components are layered and stacked within the case 1 as follows. The input terminal 6 and the output terminal 7 are placed at the bottom of the case 1, while their respective lead portions 6b and 7b are fitted into the corresponding grooves 1c of the case 1. Next, the series resonators 4 and 5 are disposed on the input terminal 6 and the output terminal 7, respectively, such that their respective support members 4d and 5d face downwardly. Subsequently, the connection terminal 10 is placed on the series resonators 4 and 5 with the respective contact portions 10b and 10c facing downwardly, so that the contact portions 10b and 10c come in contact with uppersurface electrodes 4a and 5a of the series resonators 4 and 5. At this time, a peripheral edge of the connection terminal 10 comes close to the lead portions 6b and 7b of the input terminal 6 and the output terminal 7. However, since the lead portions 6b and 7b are received in the corresponding grooves 1c, there is no fear of a short circuit arising between the connection terminal 10 and the lead portion 6b or 7b. The parallel resonator 3 is placed on the connection terminal 10, and the ground terminal 9 is then placed on the parallel resonator 3 with its lead portion 9b being fitted into the corresponding groove 1c of the case 1. Subsequently, the parallel resonator 2 is placed on the ground terminal 9, and the output terminal 8 is placed on the parallel resonator 2 with its lead portion 8b being fitted into the corresponding groove 1c of the case 1. In this step, the lead portion 9b of the ground terminal 9 comes close to the peripheral edge of the output terminal 8. However, as in the above-mentioned case, since the lead portion 9b of the ground terminal 9 is received in the corresponding groove 1c, there is no fear of a short circuit arising between the ground terminal 9 and the output terminal 8. Subsequently, the lid 11 is fitted into the opening portion 1a of the case 1.

Figure 6A:
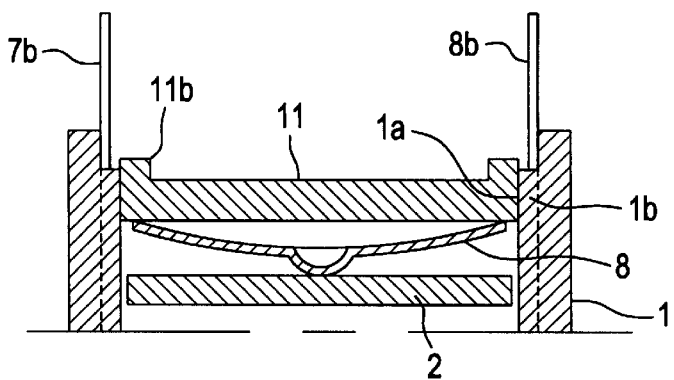
FIGS. 6A, 6B, 6C and 6D are explanatory views illustrating steps of assembling the ladder-type piezoelectric filter of FIG. 1.

During the stage where the lid 11 has been fitted into the opening portion 1a of the case 1, as shown in FIG. 6A, the output terminal 8 is slightly compressed, and the lid 11 is in a slightly lifted state.

Figure 6B:
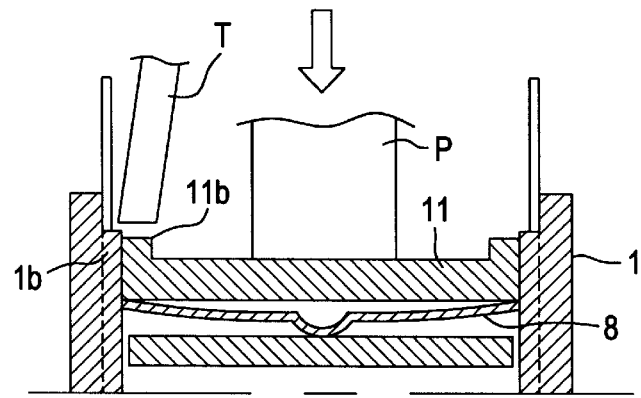

Next, as shown in FIG. 6B, the lid 11 is pressed down by use of a pusher P so that the output terminal 8 is bent or deformed, to thereby cause the components to come together under pressure. In this state, the projections 11b of the lid 11 and the ribs 1a of the case 1 are welded together by use of an iron or similar tool T. In this case, as an alternative to conventional welding, ultrasonic welding may be used.

Figure 6C:
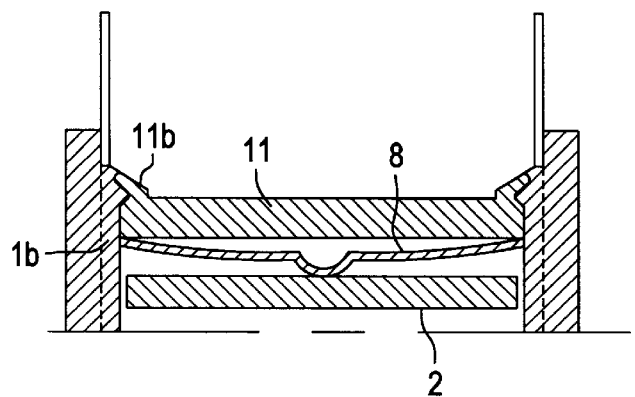

As shown in FIG. 6C, upon completion of welding, the projections 11b of the lid 11 and the ribs 1a of the case 1 are fixed together, so that detachment of the lid 11 is prevented.

Figure 6D:
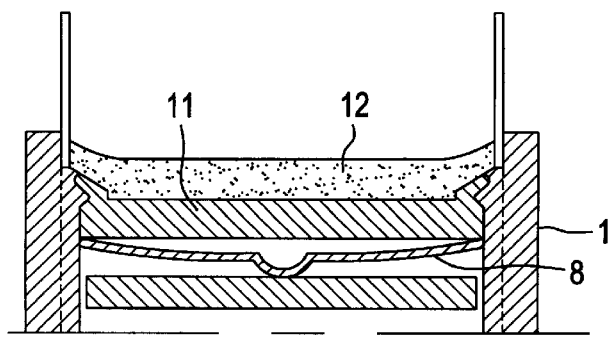

Subsequently, as shown in FIG. 6D, the liquid resin 12 is disposed into the concave space formed between the lid 11 and the opening portion 1a of the case 1 and is cured, to thereby seal the interior of the case 1.

Generally, in the case of a conventional ladder-type filter, if there are variations in thickness of the components, a predetermined contact pressure cannot be produced among components, which results in significantly lowered reliability. In contrast, in preferred embodiments of the present invention, during the step of fitting the lid 11 into the opening portion 1a of the case 1, the lid 11 can be freely moved in the depth direction of the case 1 (i.e., in the vertical direction) while its recesses 11a are guided by the ribs 1b, and the welding position can be easily and freely changed. Therefore, the lid 11 is pressed into the case 1 by use of the pusher P until a predetermined contact pressure is achieved, at which point the lid 11 is welded to the case 1. Through this operation, the contact pressure is always made constant, so that a high-reliability ladder-type filter can be obtained.

In the above-described preferred embodiments, the support member 4d (5d) is provided on the lower major surface of the series resonator 4 (5), and the upper major surface of the series resonator 4 (5) contacts the projection 10b (10c) of the connection terminal 10. However, alternatively, a support member may be provided on each of the upper and lower major surfaces of a series resonator. In this case, the projections 10b and 10c of the connection terminal 10 are not required.

Alternatively, the following structure may be used: the support members of the series resonators 4 and 5 are omitted; a laterally extending projection having a substantially identical shape as that of the projections 10b and 10c of the connection terminal 10 is provided on the upper surface of each of the input terminal 6 and the output terminal 7; and the projection contacts the approximate central portion of the lower-surface electrode of each of the series resonators 4 and 5.

In the above-described preferred embodiment, series resonators, which are piezoelectric resonators adapted to vibrate in a longitudinal vibration mode, are disposed in a side-by-side manner. However, the present invention is not limited thereto. Alternatively, the series resonators may be stacked and layered in the depth direction of a case. In this case, piezoelectric resonators adapted to vibrate in a square vibration mode are used. Alternatively, other types of piezoelectric resonators may be used (for example, see Japanese Patent Application Laid-Open (Kokai) No. 9-275325).

In the present preferred embodiment, the output terminal 8 is preferably resilient so as to achieve reliable conductive contact between the components accommodated in the case 1. However, a spring plate or cushioning material may be provided separately from the terminal.

In the above-described present preferred embodiment, the ribs provided within the case serve the functions of preventing rotation or movement of the terminals and resonators in the case, guiding the lid, and serving as a portion to which the lid is welded. However, if the inner walls of the case serve these functions, the ribs may be omitted.

The above description clearly shows that the present invention provides the following advantages and effects:

(1) Components such as terminals and resonators are stacked in a case, and a lid is pressed on the components, to thereby obtain a constant contact pressure. Therefore, difficult insertion work of components is eliminated, resulting in easy assembly. For this reason, automated mechanical assembly becomes feasible as an alternative to manual assembly, which leads to reduced assembly time and lowered cost.

(2) No contact pressure is applied when the components are stacked in the case. Therefore, no rubbing occurs between the electrode of a resonator and the projection of a terminal plate, thereby preventing damage to the electrode and maintaining electrical reliability. Conventionally, for prevention of breakage of an electrode, there has been used a thick-film electrode which is printed or baked on a plate, thus making the filter expensive. In preferred embodiments of the present invention, a thin-film electrode formed via deposition or sputtering may advantageously be used instead of the thick-film electrode, resulting in an inexpensive filter.

(3) Contact pressure can be set through control of a pressing force applied to the lid which is fitted into the opening portion of the case in the assembly final step. Therefore, a constant contact pressure can always be applied between the components, without requirement for high precision in the thicknesses of terminal plates and resonators and the interior dimensions of the case. In the case of a conventional ladder-type filter, contact pressure considerably varies from assembly to assembly. If the contact pressure is excessively high, resonators are likely to crack; whereas if the contact pressure is excessively low, the components contained in the case cause positional shift, resulting in variation of characteristics of the filter. In the present invention, the contact pressure can be always maintained constant, yielding a ladder-type filter of excellent and highly reliable quality.

(4) The lead portions of the terminals are fitted into the corresponding grooves formed on the inner surface of the case. Therefore, each lead portion is precisely positioned, so that no problems arise in relation to mounting of the filter on a printed board and the like. In addition, since the groove prevents formation of a short circuit between the lead portion of a first terminal and a second terminal, a ladder-type filter of high reliability is obtained.

While the invention has been particularly shown and described with reference to preferred embodiments thereof, it will be understood by those skilled in the art that the forgoing and other changes in form and details may be made therein without departing from the spirit of the invention.

What is claimed is:

1. A ladder-type piezoelectric filter comprising:

a case having a bottom surface, four walls extending from the bottom surface and defining an opening portions, and grooves formed on an inner surface thereof such that the grooves extend in a depth direction of the case;

a plurality of terminals arranged in the case substantially parallel to the bottom surface of the case, each of the plurality of terminals having a lead portion which is integral with the terminal and fitted into the corresponding groove of the case and projects from the opening portion of the case;

series resonators and parallel resonators, the series and parallel resonators and the terminals being arranged in the case substantially parallel to the bottom surface of the case such that the series resonators and the parallel resonators are stacked together with the terminals and are connected to each other to define a ladder circuit, a lid having four side edges and being fitted into the opening portion of the case such that the four side edges of the lid contact inner surfaces of the four walls, respectively, and such that the lid presses, in the thickness direction, the terminals and the resonators in the case to obtain a predetermined contact pressure between the terminals and the resonators, and wherein the four side edges of the lid are fixed to the inner surfaces of the four walls of the opening portion at a depth within the case that causes the lid to apply the predetermined contact pressure; and sealing resin disposed in a space defined by the lid and the opening portion of the case.

2. The ladder-type piezoelectric filter according to claim 1, wherein the case is made of thermoplastic resin.

3. The ladder-type piezoelectric filter according to claim 1, wherein the case has a box shape.

4. The ladder-type piezoelectric filter according to claim 1, wherein the lid is made of thermoplastic resin.

5. The ladder-type piezoelectric filter according to claim 1, wherein the series resonators are piezoelectric resonators adapted to vibrate in a longitudinal vibration mode and are juxtaposed on the bottom surface of the case so as to be substantially parallel to each other.

6. The ladder-type piezoelectric filter according to claim 5, wherein the parallel resonators are piezoelectric resonators adapted to vibrate in a square vibration mode and are stacked in the depth direction of the case.

7. The ladder-type piezoelectric filter according to claim 6, wherein an input terminal and a first output terminal each having a lead portion are juxtaposed at the bottom of the case, a series resonator is disposed on each of the input terminal and the first output terminal, an independent terminal having no lead portion is disposed on the series resonators such that the independent terminal contacts the series resonators, a first of the parallel resonators is disposed on the independent terminal, a ground terminal having a lead portion is disposed on the first parallel resonator; a second of the parallel resonators is disposed on the ground terminal, and a second output terminal having a lead portion is disposed on the second parallel resonator.

8. The ladder-type piezoelectric filter according to claim 6, wherein each of the series resonators has a substantially rectangular shape and has a length that is greater than a width.

9. The ladder-type piezoelectric filter according to claim 6, wherein each of the parallel resonators has a substantially square shape and has a length that is substantially equal to a width.

10. A ladder-type piezoelectric filter comprising:

a case having a bottom surface, an opening portion and grooves formed on an inner surface thereof such that the grooves extend in a depth direction of the case;

a plurality of terminals arranged in the case substantially parallel to the bottom surface of the case, each of the plurality of terminals having a lead portion which is integral with the terminal and fitted into the corresponding groove of the case and projects from the opening portion of the case;

series resonators and parallel resonators, the series and parallel resonators and the terminals being arranged in the case substantially parallel to the bottom surface of the case such that the series resonators and the parallel resonators are stacked together with the terminals and are connected to each other to define a ladder circuit, wherein the series resonators are piezoelectric resonators adapted to vibrate in a longitudinal vibration mode and are juxtaposed on the bottom surface of the case so as to be substantially parallel to each other, and wherein the parallel resonators are piezoelectric resonators adapted to vibrate in a square vibration mode and are stacked in the depth direction of the case, wherein a pair of grooves are respectively provided on one of two major surfaces of each of the series resonators at symmetrical positions with respect to a center-line which is substantially perpendicular to the longitudinal direction of the respective series resonator such that the pair of grooves extend in a direction substantially parallel to the center-line of the respective series resonator and divide the electrode on the one major surface to thereby adjust and electric capacitance between the pair of electrodes respectively disposed on the pair of major surfaces of the respective series resonator;

a lid fitted into the opening portion of the case such that the lid presses, in the thickness direction, the terminals and the resonators in the case and being fixed to the inner surface of the opening portion; and sealing resin disposed in a space defined by the lid and the opening portion of the case.

11. The ladder-type piezoelectric filter according to claim 10, wherein the series resonators each include a piezoelectric substrate and the electrodes are disposed on the piezoelectric substrate, wherein the grooves extend through said electrodes.

12. The ladder-type piezoelectric filter according to claim 11, wherein the grooves extend into said piezoelectric substrate.

13. The ladder-type piezoelectric filter according to claim 11, wherein the grooves extend substantially parallel to opposite edges of said piezoelectric substrate.

14. The ladder-type piezoelectric filter according to claim 11, wherein the grooves extend along an entire width of said piezoelectric substrate.

15. The ladder-type piezoelectric filter according to claim 11, wherein the grooves are located at opposite end regions of said piezoelectric substrate and are spaced from opposite edges of said piezoelectric substrate by substantially the same distance.

16. The ladder-type piezoelectric filter according to claim 11, wherein a support member made of a conductive material is provided on the electrode on one major surface of the series resonator on which the grooves are provided, or on the other major surface of the series resonator, at a substantially central position of the electrode in the longitudinal direction such that the support member extends substantially parallel to the center-line which is substantially perpendicular to a longitudinal direction of the series resonator.

17. A method of manufacturing a ladder-type piezoelectric filter, comprising the steps of:

providing a case having a bottom surface, four walls extending from the bottom surface and defining an opening portion, and grooves formed on an inner surface such that the grooves extend in a depth direction of the case;

alternately stacking a plurality of terminals, series resonators, and parallel resonators within the case to define a ladder circuit such that lead portions of the terminals are fitted into the grooves of the case;

fitting a lid into the opening portion of the case between inner surfaces of the four walls and pressing, in the thickness direction so as to move the lid along the inner surfaces of the four walls, thereby moving the terminals and the resonators in the case to obtain a predetermined contact pressure between the terminals and the resonators;

fixing the lid to the inner surface of the opening portion such that the terminals and resonators are pressed with the predetermined contact pressure towards the bottom surface of the case; and disposing sealing resin into a depression defined by the lid and the opening portion of the case to effect sealing.

18. The method according to claim 17, wherein the step of fixing the lid to the inner surface of the case includes the step of welding the lid to the case.

19. The method according to claim 17, wherein the case is made of thermoplastic resin.

20. The method according to claim 17, wherein the case has a box shape.

* * * * *